United States Patent
Yang et al.

(10) Patent No.: US 9,172,062 B2
(45) Date of Patent: Oct. 27, 2015

(54) COMPOSITE PHASE RETARDER AND ORGANIC LIGHT EMITTING DISPLAY APPARATUS USING THE SAME

(71) Applicant: SHENZHEN CHINA STAR OPTOELECTRONICS TECHNOLOGY CO., LTD., Shenzhen, Guangdong (CN)

(72) Inventors: Zan Yang, Guangdong (CN); Chia-Chiang Hsiao, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 13/636,923

(22) PCT Filed: Sep. 17, 2012

(86) PCT No.: PCT/CN2012/081461
§ 371 (c)(1),
(2) Date: Sep. 24, 2012

(87) PCT Pub. No.: WO2014/029148
PCT Pub. Date: Feb. 27, 2014

(65) Prior Publication Data
US 2015/0179984 A1  Jun. 25, 2015

(30) Foreign Application Priority Data
Aug. 21, 2012 (CN) .......................... 2012 1 0299209

(51) Int. Cl.
*H01L 27/146* (2006.01)
*H01L 51/52* (2006.01)
*G02B 27/26* (2006.01)
*H04N 13/04* (2006.01)
*G02B 5/30* (2006.01)
*H01L 27/32* (2006.01)

(52) U.S. Cl.
CPC .......... *H01L 51/5281* (2013.01); *G02B 5/3083* (2013.01); *G02B 27/26* (2013.01); *H01L 27/3244* (2013.01); *H04N 13/0434* (2013.01); *H04N 2213/001* (2013.01)

(58) Field of Classification Search
CPC ....... G02B 5/1857; G02B 5/18; G02B 5/1842
USPC ................................... 349/114; 257/434, 435
See application file for complete search history.

(56) References Cited

U.S. PATENT DOCUMENTS

| 5,519,523 A * | 5/1996 | Madoroko et al. ............ 349/117 |
| 6,097,461 A | 8/2000 | Sharp |
| 2006/0138942 A1* | 6/2006 | Bang et al. .................... 313/504 |
| 2011/0234079 A1* | 9/2011 | Eom et al. ..................... 313/112 |
| 2012/0320316 A1* | 12/2012 | Yanai et al. ..................... 349/96 |

FOREIGN PATENT DOCUMENTS

| CN | 1575073 A | 2/2005 |
| CN | 101950100 A | 1/2011 |
| CN | 102368100 A | 3/2012 |
| CN | 102368128 A | 3/2012 |
| JP | 2004-279437 A | 10/2004 |

* cited by examiner

*Primary Examiner* — Caridad Everhart
(74) *Attorney, Agent, or Firm* — Muncy, Geissler, Olds & Lowe, P.C.

(57) ABSTRACT

The present invention provides a composite phase retarder and an organic light emitting display apparatus using the same. The organic light emitting display apparatus comprises an organic light emitting display panel and the composite phase retarder. The composite phase retarder comprises a quarter wave (λ/4) phase retarder, a polarizer and a pattern retarder stacked in sequence. The present invention can be applicable to display 3D images and enhance a display contrast of the organic light emitting display apparatus.

13 Claims, 3 Drawing Sheets

COMPOSITE PHASE RETARDER AND ORGANIC LIGHT EMITTING DISPLAY APPARATUS USING THE SAME

FIELD OF THE INVENTION

The present invention relates to a composite phase retarder and an organic light emitting display apparatus using the same, and more particularly to a composite phase retarder and a display apparatus using the same for organic light emitting diode (OLED) displays.

BACKGROUND OF THE INVENTION

Recently, with technological advantages, many types of display apparatus have been widely applied in flat panel displays (FPDs), such as liquid crystal displays (LCDs), electro luminescence (EL) displays or organic light-emitting diode (OLED) displays. The OLED display has many characteristics in its properties including superior light, thin, entire solid, high luminescent, high-speed response, etc., and thus it is suitable for the flat panel displays.

At present, the LCDs are capable of displaying three dimension (3D) images. However, the OLED display capable of displaying 3D images is still required to be developed.

In addition, in a general OLED display, ambient light rays are likely to be reflected by metal electrodes of the OLED display, thereby deteriorating a display contrast of the OLED display.

As a result, it is necessary to provide a composite phase retarder and an organic light emitting display apparatus using the same to solve the problems existing in conventional technologies such as above-mentioned.

SUMMARY OF THE INVENTION

The present invention provides a composite phase retarder and an organic light emitting display apparatus using the same to solve the problems existing in conventional OLED displays.

A primary object of the present invention is to provide a composite phase retarder for an organic light emitting display apparatus, comprising: a quarter wave ($\lambda/4$) phase retarder configured to be bonded to an organic light emitting display panel; a polarizer disposed on the $\lambda/4$ phase retarder; and a pattern retarder disposed on the polarizer.

A secondary object of the present invention is to provide an organic light emitting display apparatus, and the organic light emitting display apparatus comprises: an organic light emitting display panel; and a composite phase retarder comprising: a $\lambda/4$ phase retarder configured to be bonded to the organic light emitting display panel; a polarizer disposed on the $\lambda/4$ phase retarder; and a pattern retarder disposed on the polarizer.

In one embodiment of the present invention, the pattern retarder includes a plurality of half wave ($\lambda/2$) retardation rows and a plurality of isotropic material rows arranged in an alternating manner.

In one embodiment of the present invention, the composite phase retarder further comprises a full $\lambda/4$ phase retarder, and the full $\lambda/4$ phase retarder is disposed close to a light emitting side of the pattern retarder.

In one embodiment of the present invention, the a plurality of first $\lambda/4$ retardation rows and a plurality of second $\lambda/4$ retardation rows arranged in an alternating manner, and slow axes of the first $\lambda/4$ retardation rows are vertical to slow axes of the second $\lambda/4$ retardation rows.

In one embodiment of the present invention, the composite phase retarder further comprises triacetyl cellulose (TAC) films configured to protect and support films in the composite phase retarder.

In one embodiment of the present invention, the composite phase retarder further comprises a passivation film positioned at a light emitting side of the composite phase retarder.

In one embodiment of the present invention, the composite phase retarder further comprises an adhesive layer configured to bond the $\lambda/4$ phase retarder to the organic light emitting display panel In one embodiment of the present invention, the $\lambda/4$ phase retarder is disposed close to a cathode of the organic light emitting display panel.

In one embodiment of the present invention, the organic light emitting display panel further comprises a passivation layer positioned at a light-emitting side of the organic light emitting display panel.

The composite phase retarder of the present invention can be disposed on the organic light emitting display apparatus for forming the 3D image effect. In addition, the $\lambda/4$ phase retarder and the polarizer can efficiently absorb ambient light rays for reducing the effect of the ambient light rays on a display contrast of the organic light emitting display apparatus, as well as enhancing a display quality thereof. Therefore, the organic light emitting display apparatus of the present invention can display 3D images and enhance the display quality thereof. Moreover, in the composite phase retarder, bonding steps of films and the thickness thereof can be reduced, thus facilitating to the reduction in process time and the 3D viewing angle.

The structure and the technical means adopted by the present invention to achieve the above-mentioned and other objects can be best understood by referring to the following detailed description of the preferred embodiments and the accompanying drawings:

DETAILED DESCRIPTION OF THE PREFERRED EMBODIMENTS

Figure 1:
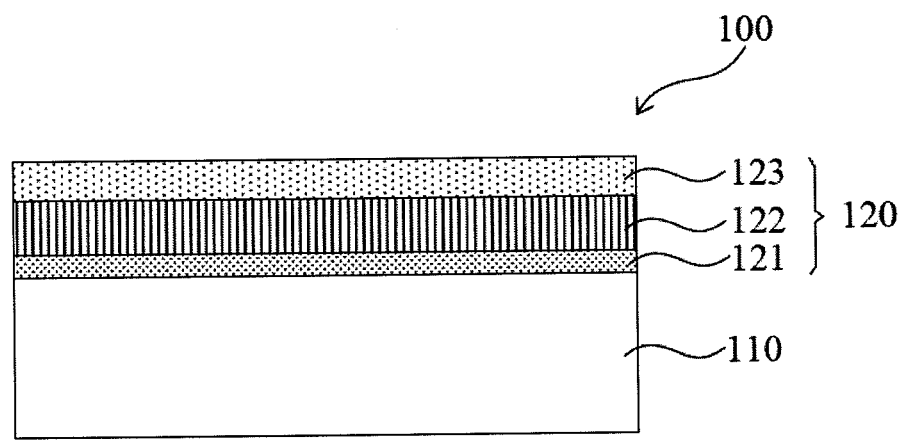
FIG. 1 is a schematic diagram showing an organic light emitting display apparatus according to one embodiment of the present invention.

The following embodiments are referring to the accompanying drawings for exemplifying specific implementable embodiments of the present invention. Furthermore, directional terms described by the present invention, such as upper, lower, front, back, left, right, inner, outer, side and etc., are only directions by referring to the accompanying drawings, and thus the used directional terms are used to describe and understand the present invention, but the present invention is not limited thereto.

The drawings and description are to be regarded as illustrative in nature and not restrictive. Like reference numerals designate like elements throughout the specification. In addition, the size and thickness of each component shown in the drawings are arbitrarily shown for understanding and ease of description, but the present invention is not limited thereto.

In the drawings, the thickness of layers, films, panels, regions, etc., are exaggerated for clarity. In the drawings, for understanding and ease of description, the thicknesses of some layers and areas are exaggerated. It will be understood that, when an element such as a layer, film, region, or substrate is referred to as being "on" another element, it can be directly on the other element or intervening elements may also be present.

In addition, in the specification, unless explicitly described to the contrary, the word "comprise" and variations such as "comprises" or "comprising" will be understood to imply the inclusion of stated elements but not the exclusion of any other elements. Furthermore, in the specification, "on" implies being positioned above or below a target element and does not imply being necessarily positioned on the top on the basis of a gravity direction.

Referring to FIG. 1, a schematic diagram showing an organic light emitting display apparatus according to one embodiment of the present invention is illustrated. The organic light emitting display apparatus 100 of the present embodiment is capable of displaying 3D images. When viewing the 3D images displayed by the organic light emitting display 100, users can use polarizer glasses (not shown) to experience a 3D image effect. The organic light emitting display apparatus 100 can comprise an organic light emitting display panel 110 and a composite phase retarder 120. The composite phase retarder 120 is disposed at a light emitting side of the organic light emitting display panel 110 for forming the 3D image effect.

Figure 2:
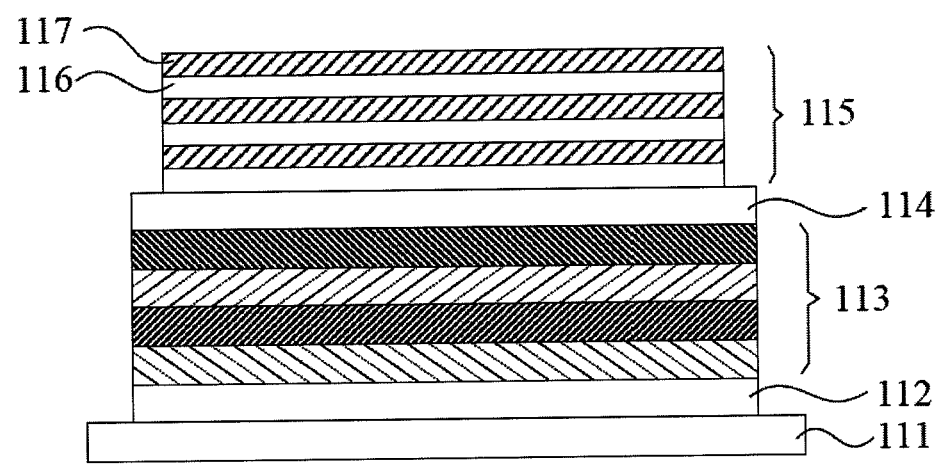
FIG. 2 is a schematic diagram showing an organic light emitting display panel according to one embodiment of the present invention.

Referring to FIG. 2, a schematic diagram showing the organic light emitting display panel according to one embodiment of the present invention is illustrated. The organic light emitting display panel 110 of the present embodiment can comprise a substrate 111, first electrode 112, an organic emission layer 113, a second electrode 114 and a passivation layer 115, and the substrate 111, the first electrode 112, the organic emission layer 113, the second electrode 114 and the passivation layer 115 are formed on the substrate 111 in sequence. The substrate 111 may be a glass substrate, a flexible plastic substrate, a wafer substrate or a heat dissipation substrate. The substrate 111 may comprise a plurality of pixel regions (not shown), a plurality of signal lines (not shown) and switch elements (not shown). The signal lines are configured to transmit signals, such as scan signals, data signals or test signals. The signal lines may be gate lines and data lines, wherein the gate lines insulatively cross the data lines, so as to form the pixel regions in a matrix manner for displaying images. The switch elements may be thin film transistors (TFTs) disposed in the pixel regions and electrically connected to the adjacent signal lines.

Referring to FIG. 2, in this embodiment, the organic light emitting display panel 110 may be a top-emitting type OLED device. In this case, the first electrode 112 is formed on the substrate 111 to act as an anode, and the second electrode 114 is disposed close to a light-emitting side of the organic light emitting display panel 110 to act as a cathode. The first electrode 112 is preferably made of a highly reflective metal, such as silver (Ag), silver oxide, gold (Au), aluminum (Al) or any alloy thereof. The second electrode 114 is preferably made of a transparent conductive material, such as ITO, IZO, AZO, GZO, TCO or ZnO. The organic emission layer 113 is formed between the first electrode 112 and the second electrode 114. In one embodiment, the organic emission layer 113 can comprise a hole injection layer, a hole transportation layer, an emission layer (such as an organic layer for emitting white light or other colors), an electron transportation layer and an electron injection layer stacked on the first electrode 112 in sequence. In this case, the organic emission layer 113 can be drove to emit light by the current which is provided by the switch elements. The light of organic emission layer 113 can be sent out through the transparent second electrode 114 and the transparent passivation layer 115. Furthermore, a portion of the light emitted from the organic emission layer 113 can be reflected by the first electrode 112, and then sent out through the transparent second electrode 114.

Referring to FIG. 2, the passivation layer 115 is positioned at the light-emitting side of the organic light emitting display panel 110 for protecting the second electrode 114. In this embodiment, the passivation layer 115 can comprise sub-passivation layers 116 and organic layers 117 which are stacked on the second electrode 114 in an alternating manner. The material of the sub-passivation layers 116 may be $SiN_x$ and/or $SiO_x$, and the organic layers 117 are configured to prevent the sub-passivation layers 116 from fragility, so as to enhance the structure of the passivation layer 115.

Referring to FIG. 1, the composite phase retarder 120 is disposed close to the second electrode 114 of the organic light emitting display panel 110, i.e. close to the light-emitting side of the organic light emitting display panel 110 for forming left or right handed circularly polarized light rays. In this embodiment, the composite phase retarder 120 is disposed on the passivation layer 115 of the organic light emitting display panel 110. The organic light emitting display panel 110 comprises a quarter wave ($\lambda/4$) phase retarder 121, a polarizer 122 and a pattern retarder 123. The $\lambda/4$ phase retarder 121 is configured to be bonded to the organic light emitting display panel 110, and the polarizer 122 is disposed on the $\lambda/4$ phase retarder 121, and the pattern retarder 123 is disposed on the polarizer 122. In this case, a thickness of the composite phase retarder 120 may be less than or equal to 1.5 mm, such as less than or equal to 0.8 mm.

In one embodiment, when assembling the organic light emitting display apparatus 100, the $\lambda/4$ phase retarder 121, the polarizer 122 and the pattern retarder 123 can be first bonded as one piece by rollers (not shown), so as to form the composite phase retarder 120, and then the composite phase retarder 120 is boned to the organic light emitting display panel 110. In another embodiment, the composite phase retarder 120 may comprise two passivation films (not shown) disposed at both sides thereof for protection.

Referring to FIG. 1 and FIG. 2, the $\lambda/4$ phase retarder 121 may be disposed close to the second electrode 114 of the organic light emitting display panel 110, and the polarizer 122 is disposed between the $\lambda/4$ phase retarder 121 and the pattern retarder 123. The polarizer 122 may be a poly vinyl alcohol (PVA) film. In this embodiment, the $\lambda/4$ phase retarder 121 and the polarizer 122 can be equal to a circular polarizer, such that ambient light rays can be transformed into circularly polarized light rays by passing through the $\lambda/4$ phase retarder 121 and the polarizer 122 in sequence. When the circularly polarized light rays are reflected back to the circular polarizer (the $\lambda/4$ phase retarder 121 and the polarizer 122) of the organic light emitting display panel 110, the circularly polarized light rays can be absorbed by the circular polarizer. Therefore, the ambient light rays can be absorbed by the $\lambda/4$ phase retarder 121 and the polarizer 122, thereby reducing the effect of the ambient light rays on a display contrast of the organic light emitting display apparatus 100, as well as enhancing a display quality thereof.

Figure 3:
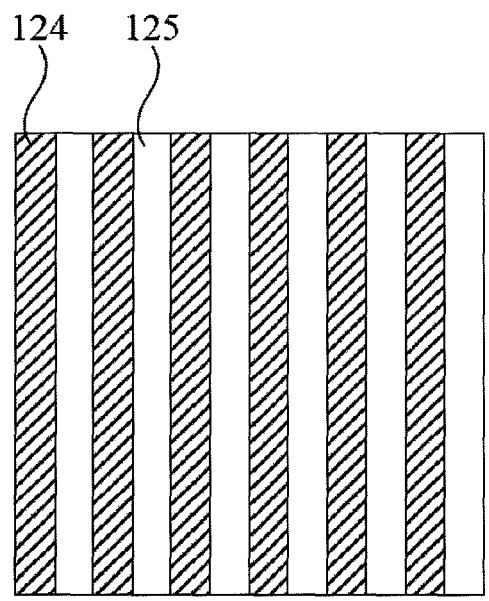
FIG. 3 is a schematic diagram showing a pattern retarder according to one embodiment of the present invention.

Referring to FIG. 1 and FIG. 3, FIG. 3 is a schematic diagram showing the pattern retarder according to one embodiment of the present invention. The pattern retarder 123 is disposed at a light emitting side of the composite phase retarder 120. In this embodiment, the pattern retarder 123 can include a plurality of half wave (λ/2) retardation rows 124 and a plurality of isotropic material rows 125. The λ/2 retardation rows 124 and the isotropic material rows 125 are arranged in an alternating manner, and a predetermined space (i.e. a width of the isotropic material row 125) is between each two of the adjacent λ/2 retardation rows 124. The λ/2 retardation rows 124 are positioned to right eye pixel rows (not shown) of the organic light emitting display panel 110, and the isotropic material rows 125 are positioned to left eye pixel rows (not shown) of the organic light emitting display panel 110. The right and left eye pixel rows are positioned at odd and even pixel rows of the organic light emitting display panel 110. In this case, the λ/2 retardation rows 124 can a characteristic of a normal λ/2 phase retarder. Furthermore, in the pattern retarder 123 of the present embodiment, a full λ/4 phase retarder may be used to transform polarized light rays from the λ/2 retardation rows 124 and the isotropic material rows 125 into the left or right handed circularly polarized light rays.

Figure 4:
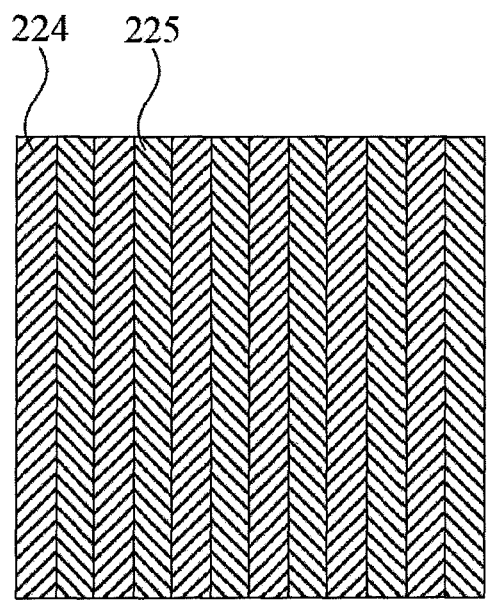
FIG. 4 is a schematic diagram showing a pattern retarder according to another embodiment of the present invention.

Referring to FIG. 4, a schematic diagram showing a pattern retarder according to another embodiment of the present invention is illustrated. In another embodiment, the pattern retarder 123 can comprise a plurality of first λ/4 retardation rows 224 and a plurality of second λ/4 retardation rows 225, and the first λ/4 retardation rows 224 and the plurality of second λ/4 retardation rows 225 are arranged in an alternating manner and positioned to the right and left eye pixel rows of the organic light emitting display panel 110, respectively. In this case, the λ/4 retardation rows 224, 225 can a characteristic of a normal λ/4 phase retarder, and slow axes of the first λ/4 retardation rows 224 are preferably vertical to slow axes of the second λ/4 retardation rows 225. Therefore, with the use of the λ/4 retardation rows 224, 225, linearly polarized light rays from the polarizer 122 can be transformed into the left or right handed circularly polarized light rays.

Figure 5:
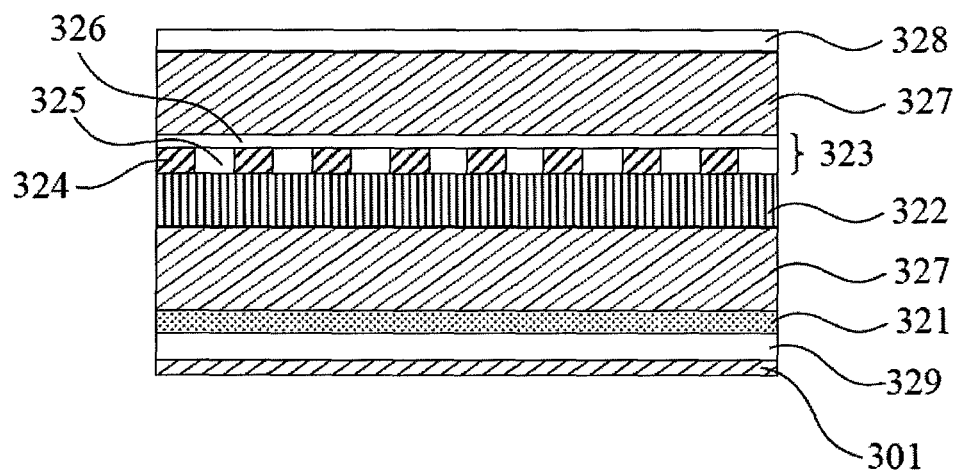
FIG. 5 is a schematic diagram showing a composite phase retarder according to still another embodiment of the present invention.

Referring to FIG. 5, a schematic diagram showing a composite phase retarder according to still another embodiment of the present invention is illustrated. In still another embodiment, the composite phase retarder 120 can comprise a λ/4 phase retarder 321, a polarizer 322, a pattern retarder 323, two triacetyl cellulose (TAC) films 327, a passivation film 328 and an adhesive layer 329. The adhesive layer 329, the λ/4 phase retarder 321, one of the TAC films 327, the polarizer 322, the pattern retarder 323, another one of the TAC films 327 and the passivation film 328 are stacked in sequence. The pattern retarder 323 may comprise retardation rows 324 and 325 and a full λ/4 phase retarder 326. The retardation rows 324 and 325 are arranged in an alternating manner and have λ/2, λ/4 or zero retardation. The full λ/4 phase retarder 326 is disposed close to a light emitting side of the pattern retarder 323.

Referring to FIG. 5 again, the TAC films 327 are configured to protect and support the films in the composite phase retarder 120. The passivation film 328 is positioned at the light emitting side of the composite phase retarder 120 for protection. The adhesive layer 329 is configured to bond the λ/4 phase retarder 321 to the organic light emitting display panel 110. Before bonding the composite phase retarder 120 to the organic light emitting display panel 110, the composite phase retarder 120 can have a release film 301 disposed on the adhesive layer 329 for preventing the adhesive layer 329 from adhering to other objects except the organic light emitting display panel 110.

Referring to FIG. 1, when users view the 3D images of the organic light emitting display apparatus 100 of the present embodiment, the polarizer glasses can be used to form the 3D image effect. At this time, in the composite phase retarder 120, the linearly polarized light rays emitted from the polarizer 122 can be transformed into the left or right handed circularly polarized light rays by the pattern retarder 123. Since the left or right handed circularly polarized light rays are only allowed to pass through one side (a right side or a left side) of the polarizer glasses. In other words, the user's eyes can view images of different pixel rows of the organic light emitting display apparatus 100, respectively, thereby forming the 3D image effect.

As described above, the composite phase retarder of the present invention can be disposed on the organic light emitting display apparatus for forming left or right handed circularly polarized light rays, and thus the polarizer glasses can be used for forming the 3D image effect. In addition, the λ/4 phase retarder and the polarizer can efficiently absorb the ambient light rays for reducing the effect of the ambient light rays on a display contrast of the organic light emitting display apparatus, as well as enhancing a display quality thereof. Moreover, in the composite phase retarder, the λ/4 phase retarder, the polarizer and the pattern retarder are integrated into one piece, thereby reducing bonding steps and the thickness thereof, thus facilitating to the reduction in process time and the 3D viewing angle.

The present invention has been described with a preferred embodiment thereof and it is understood that many changes and modifications to the described embodiment can be carried out without departing from the scope and the spirit of the invention that is intended to be limited only by the appended claims.

The invention claimed is:

1. An organic light emitting display apparatus, comprising:
an organic light emitting display panel; and
a composite phase retarder comprising:
   a quarter wave (λ/4) phase retarder configured to be bonded to the organic light emitting display panel;
   a polarizer disposed on the λ/4 phase retarder;
   a pattern retarder disposed on the polarizer; and
   an adhesive layer configured to bond the λ/4 phase retarder to the organic light emitting display panel;
   wherein the pattern retarder includes a plurality of half wave (λ/2) retardation rows and a plurality of isotropic material rows arranged in an alternating manner.

2. The organic light emitting display apparatus according to claim 1, wherein the composite phase retarder further comprises a full λ/4 phase retarder, and the full λ/4 phase retarder is disposed close to a light emitting side of the pattern retarder.

3. The organic light emitting display apparatus according to claim 1, wherein the composite phase retarder further comprises triacetyl cellulose (TAC) films configured to protect and support films in the composite phase retarder.

4. The organic light emitting display apparatus according to claim 1, wherein the composite phase retarder further comprises a passivation film positioned at a light emitting side of the composite phase retarder.

5. The organic light emitting display apparatus according to claim 1, wherein the λ/4 phase retarder is disposed close to a cathode of the organic light emitting display panel.

6. The organic light emitting display apparatus according to claim 1, wherein the organic light emitting display panel further comprises a passivation layer positioned at a light-emitting side of the organic light emitting display panel.

7. A composite phase retarder, comprising:
a $\lambda/4$ phase retarder configured to be bonded to the organic light emitting display panel;
a polarizer disposed on the $\lambda/4$ phase retarder;
a pattern retarder disposed on the polarizer; and
an adhesive layer configured to bond the $\lambda/4$ phase retarder to the organic light emitting display panel;
wherein the pattern retarder a plurality of $\lambda/2$ retardation rows and a plurality of isotropic material rows arranged in an alternating manner.

8. The composite phase retarder according to claim 7, wherein the composite phase retarder further comprises a full $\lambda/4$ phase retarder, and the full $\lambda/4$ phase retarder is disposed close to a light emitting side of the pattern retarder.

9. The composite phase retarder according to claim 7, further comprising TAC films configured to protect and support films in the composite phase retarder.

10. The composite phase retarder according to claim 7, further comprising a passivation film positioned at a light emitting side of the composite phase retarder.

11. An organic light emitting display apparatus, comprising:
an organic light emitting display panel; and
a composite phase retarder comprising:
a $\lambda/4$ phase retarder configured to be bonded to the organic light emitting display panel;
a polarizer disposed on the $\lambda/4$ phase retarder; and
a pattern retarder disposed on the polarizer;
wherein the pattern retarder includes a plurality of $\lambda/2$ retardation rows and a plurality of isotropic material rows arranged in an alternating manner.

12. The organic light emitting display apparatus according to claim 11, wherein the $\lambda/4$ phase retarder is disposed close to a cathode of the organic light emitting display panel.

13. The organic light emitting display apparatus according to claim 11, wherein the organic light emitting display panel further comprises a passivation layer positioned at a light-emitting side of the organic light emitting display panel.

* * * * *